(12) United States Patent
Chou

(10) Patent No.: US 6,445,586 B1
(45) Date of Patent: Sep. 3, 2002

(54) APPARATUS FOR MAINFRAME HAVING REDUNDANT EXTRACTABLE DEVICES

(75) Inventor: Chin-Wen Chou, Taipei (TW)

(73) Assignee: Shin Jiuh Corporation, Taipei Hsien (TW)

( * ) Notice: Subject to any disclaimer, the term of this patent is extended or adjusted under 35 U.S.C. 154(b) by 77 days.

(21) Appl. No.: 09/619,703

(22) Filed: Jul. 19, 2000

(51) Int. Cl.[7] .................................................. H05K 5/02
(52) U.S. Cl. ........................ 361/725; 361/683; 361/695; 312/223.1; 312/223.2
(58) Field of Search ................................ 361/724–727, 361/681–686, 694, 695, 692, 831; 312/223.1, 223.2

(56) References Cited

U.S. PATENT DOCUMENTS

| | | | | |
|---|---|---|---|---|
| 5,332,306 A | * | 7/1994 | Babb et al. | 312/334.16 |
| 5,612,854 A | * | 3/1997 | Wiscombe et al. | 361/727 |
| 5,822,184 A | * | 10/1998 | Rabinovitz | 361/685 |
| 5,896,273 A | * | 4/1999 | Barghese et al. | 361/724 |
| 6,018,456 A | * | 1/2000 | Young et al. | 361/684 |
| 6,175,490 B1 | * | 1/2001 | Papa et al. | 361/686 |

* cited by examiner

Primary Examiner—Darren Schuberg
Assistant Examiner—David Foster
(74) Attorney, Agent, or Firm—Bacon & Thomas

(57) ABSTRACT

An apparatus for a mainframe having redundant extractable devices is arranged in a mainframe of the IU specification for industrial computers or servos. The apparatus comprises a main body having at least two receiving spaces with respective openings at one end; closing ends of the two receiving spaces is arranged with a circuit board; two extractable units arranged within the receiving spaces and connected; to the circuit board; a front frame and a rear frame being installed at the main body. The two extractable units are extractable from the two openings so as to be connected to the circuit board. Moreover, the two extractable units are mounted to the main body and the main body is extractable in the computer mainframe, and thus an apparatus for a mainframe having redundant extractable devices is formed.

6 Claims, 6 Drawing Sheets

APPARATUS FOR MAINFRAME HAVING REDUNDANT EXTRACTABLE DEVICES

BACKGROUND OF THE INVENTION

The present invention relates to an apparatus for a mainframe having redundant extractable devices in a mainframe, in which each extractable unit and a main body are extractable individually.

In the current days, internets and e-commerce are prevailed and become more and more popular. The internet providers or network service providers need many computer mainframes and related equipment the number of which is correspondent to the connected consumers for providing a good service to the consumers. However, the space is confined and can not be expanded as desired. Therefore, to reduce the volume of a computer mainframe becomes a fast and simple way for resolving this problem. The prior art industrial standard casing for arranging computer mainframes or network devices is suitable for a 5 U (1.75 inches×5) or 4 U (1.75 inches×4) computer mainframe, but in future, there is a trend to use a 2 U (1.75 inches×2), even 1 U (1.75 inch) standard computer mainframe. Therefore, the same space has a capacity of 5 times. This is a preferred method for suiting the future trend of too many connections to network stations.

However, since the space is reduced, and thus the parts therein must be adjusted. Since the original parts can not be reduced by the limitation of the specification. Especially, for power supply, due the confinement of the height of IU specification, it can not be installed with a redundant power supply as the 5 U, 4 U and 3 U specifications. Only one power supply can be fixed to the computer mainframe. Therefore, once the power supply is fault, the power is interrupted and the computer mainframe will shutdown. Since the power supply is secured in the mainframe, it is hard to detach the power supply. This is a big trouble to the network service providers who use power supplies continuously. Therefore, to provide a convenient way for detaching and attaching the power supply and to provide a redundant power supply are a primary concern in the computer or servos having an IU specification.

SUMMARY OF THE INVENTION

Accordingly, the primary object of the present invention is to provide an apparatus for a mainframe having redundant extractable devices which can improve the defects in the prior art.

In order to achieve aforesaid objects, the present invention provides an apparatus for a fault-tolerant extractable device arranged in a main body of the IU specification for industrial computers or servos. The extractable device comprises a main body 1 having at least two receiving spaces with respective openings at one end; closing ends of the two receiving spaces is arranged with a circuit board 14; two extractable units 2, 2' arranged within the receiving spaces and connected to the circuit board 14; a front frame 4 and a rear frame 3 being installed at the main body 1. The two extractable units 2, 2 are extractable from the two openings so as to be connected to the circuit board. Moreover, the two extractable units are mounted to the main body and the main body is extractable in the computer mainframe.

The various objects and advantages of the present invention will be more readily understood from the following detailed description when read in conjunction with the appended drawing.

DETAILED DESCRIPTION OF THE PREFERRED EMBODIMENTS

Figure 1:
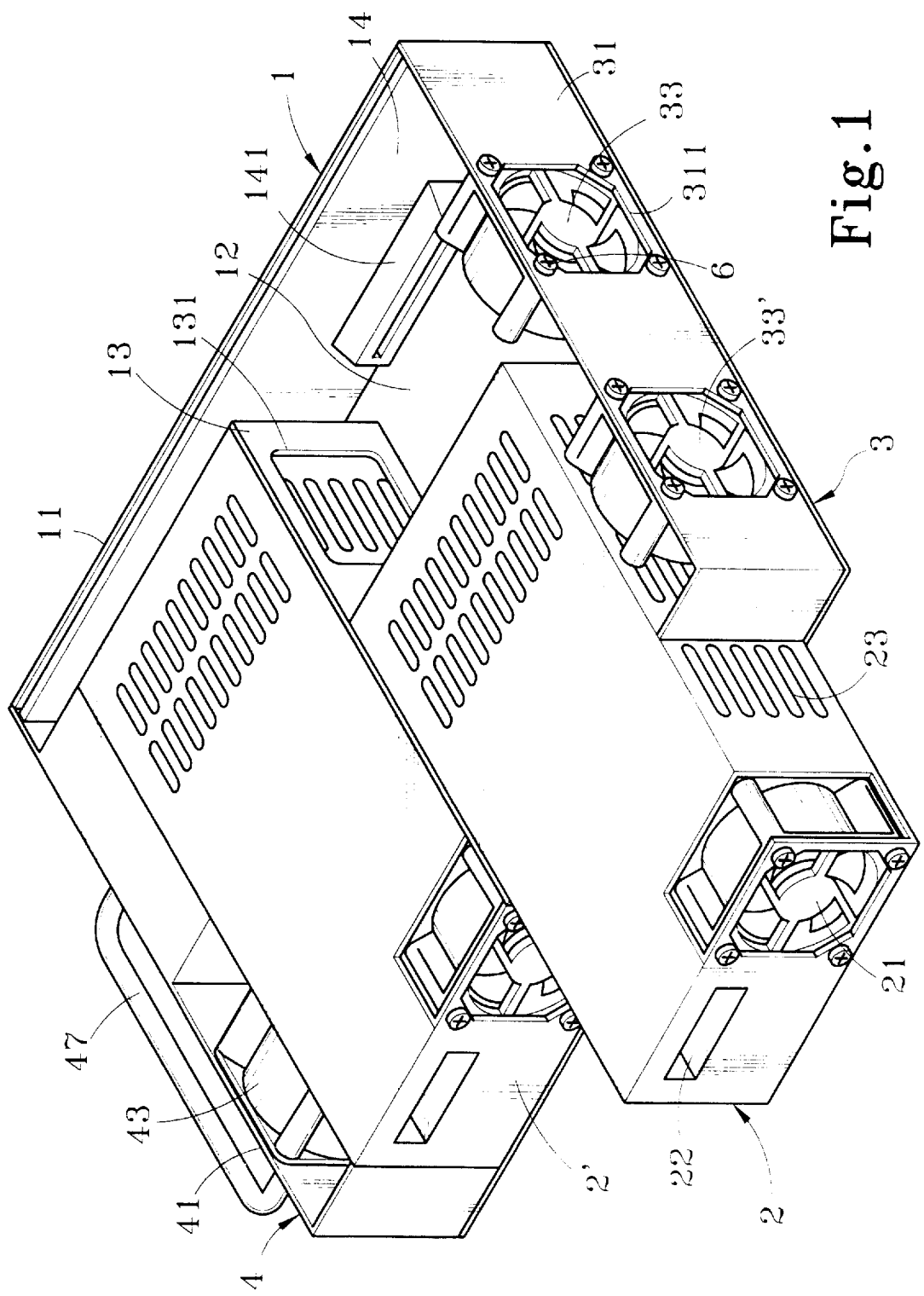
FIG. 1 is a schematic perspective view of the present invention.
Figure 2:
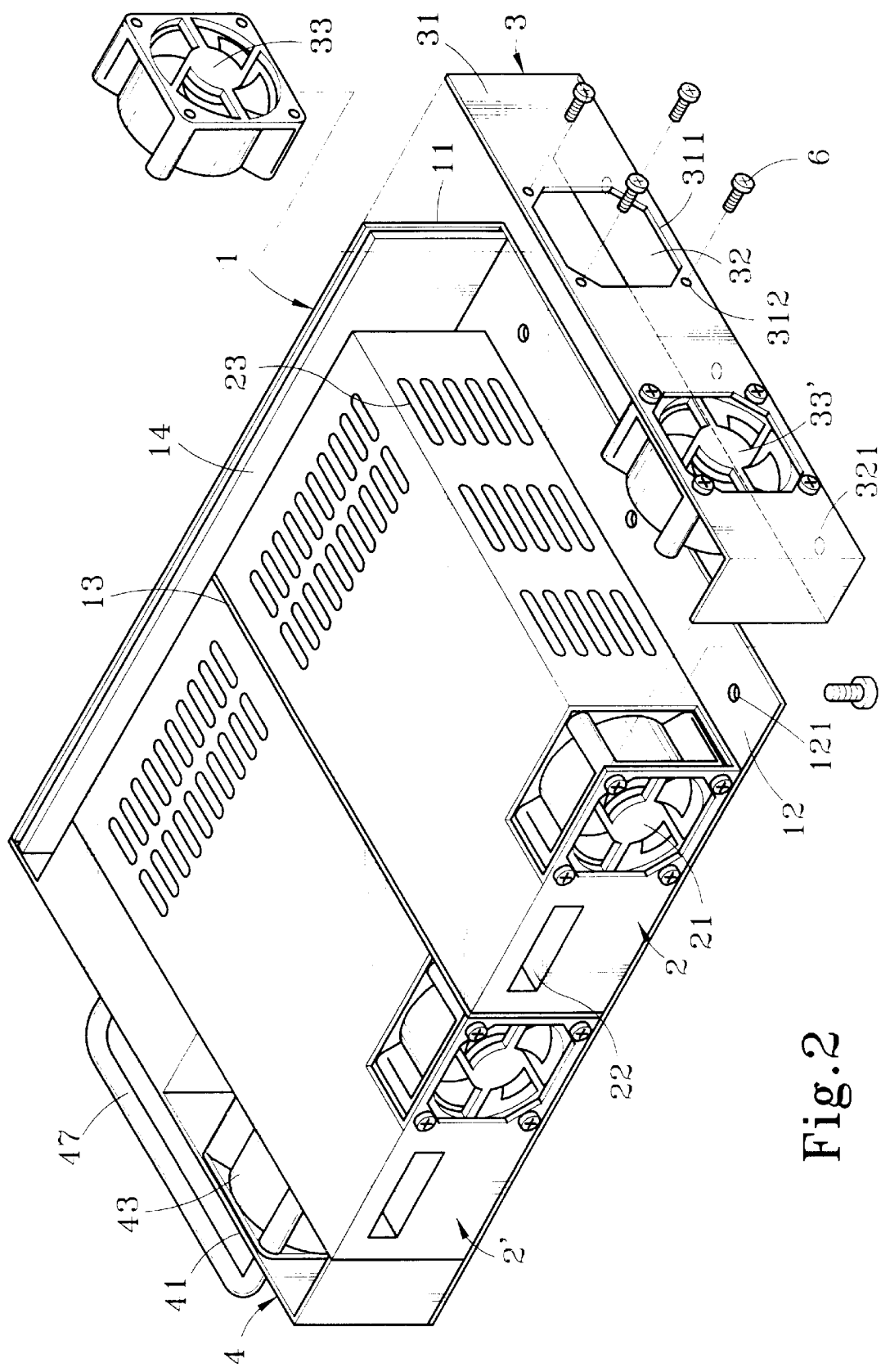
FIG. 2 is a structural exploded perspective view of the present invention.
Figure 3:
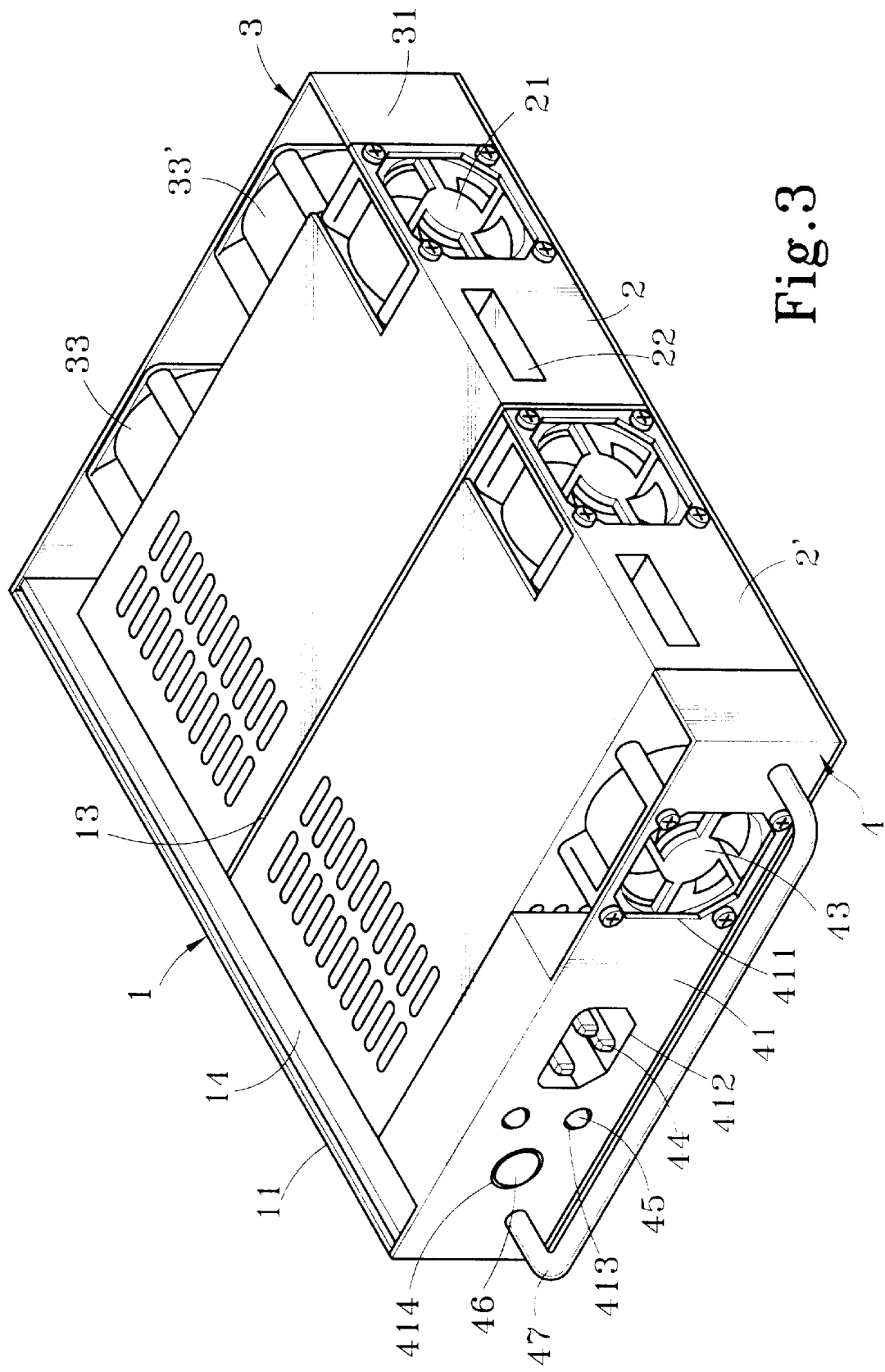
FIG. 3 is another perspective view of the present invention viewing from another direction.

With reference to FIGS. 1, 2, 3 and 5, the perspective view and structural exploded view of the present invention are illustrated. As shown in the figures, in the present invention, a computer mainframe 5 of IU specification used in industrial computers or servos in common is formed with an mounting space with an opening for plug-in extractable device by a set of front and rear spacers 52 and 53, and a lateral wall 51 of the housing of the computer mainframe 5. The extractable device includes a main body 1, and two extractable units 2 and 2' arranged within the main body 1.

The main body 1 is bent and includes a supporting portion 11 and a bearing portion 12. The main body 1 is firmly secured with at least one spacing portion 13 with at least one through hole 131 or heat dissipating holes for dividing into two receiving spaces with respective openings. At closing ends of the two receiving spaces are arranged with a circuit board 14 retained to the supporting portion 11. A front frame 4 and a rear frame 3 are installed at the main body 1 adjacent to the two receiving spaces. The frames 3 and 4 has a bottom plate 32. The bottom plate 32 has a hole 321 by which it can be fixed to the main body 1 and then is screwedly to the hole 121 of the bearing portion 12. The front frame 4 has a plurality of through holes 411, 412, 413, 414 and screw holes for being installed with a panel 41. The panel is arranged with a radiating fan 43, a power input port 44, a display lamp set 45, a restoring switch 46 and a handle 47. The rear frame 4 has a panel 31 which is formed with a plurality of through holes 311 and a screw hole 312 and is installed with a plurality of radiating fans 33 and 33'. The opening of the two receiving spaces are inserted with two-extractable units 2 and 2' which are connected to the slots 141 of the circuit board 14. The extractable unit 2, 2' may be power supplies or data storage-devices (for example, hard disks).

Figure 4:
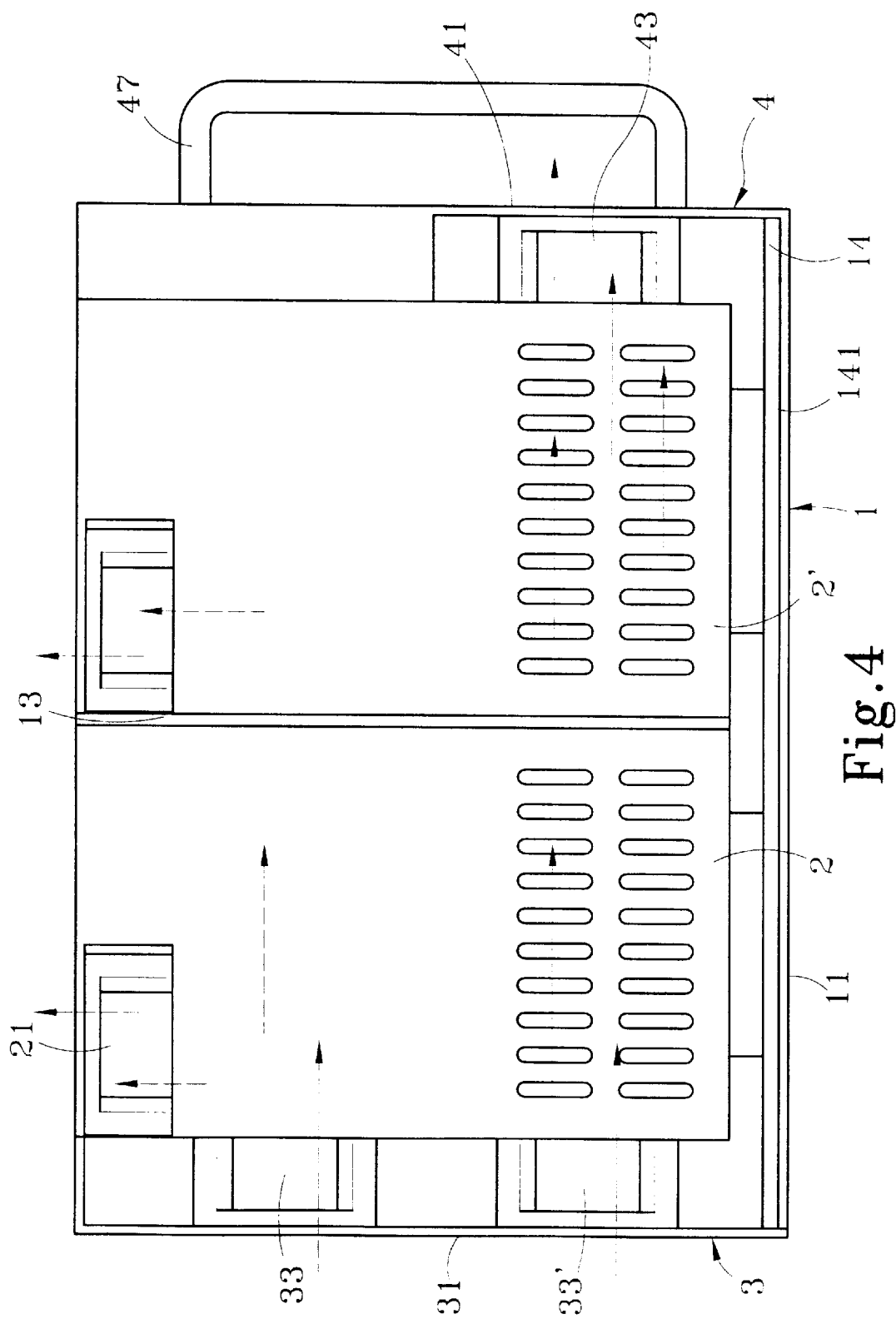
FIG. 4 is schematic view showing the flow of air in the present invention.
Figure 5:
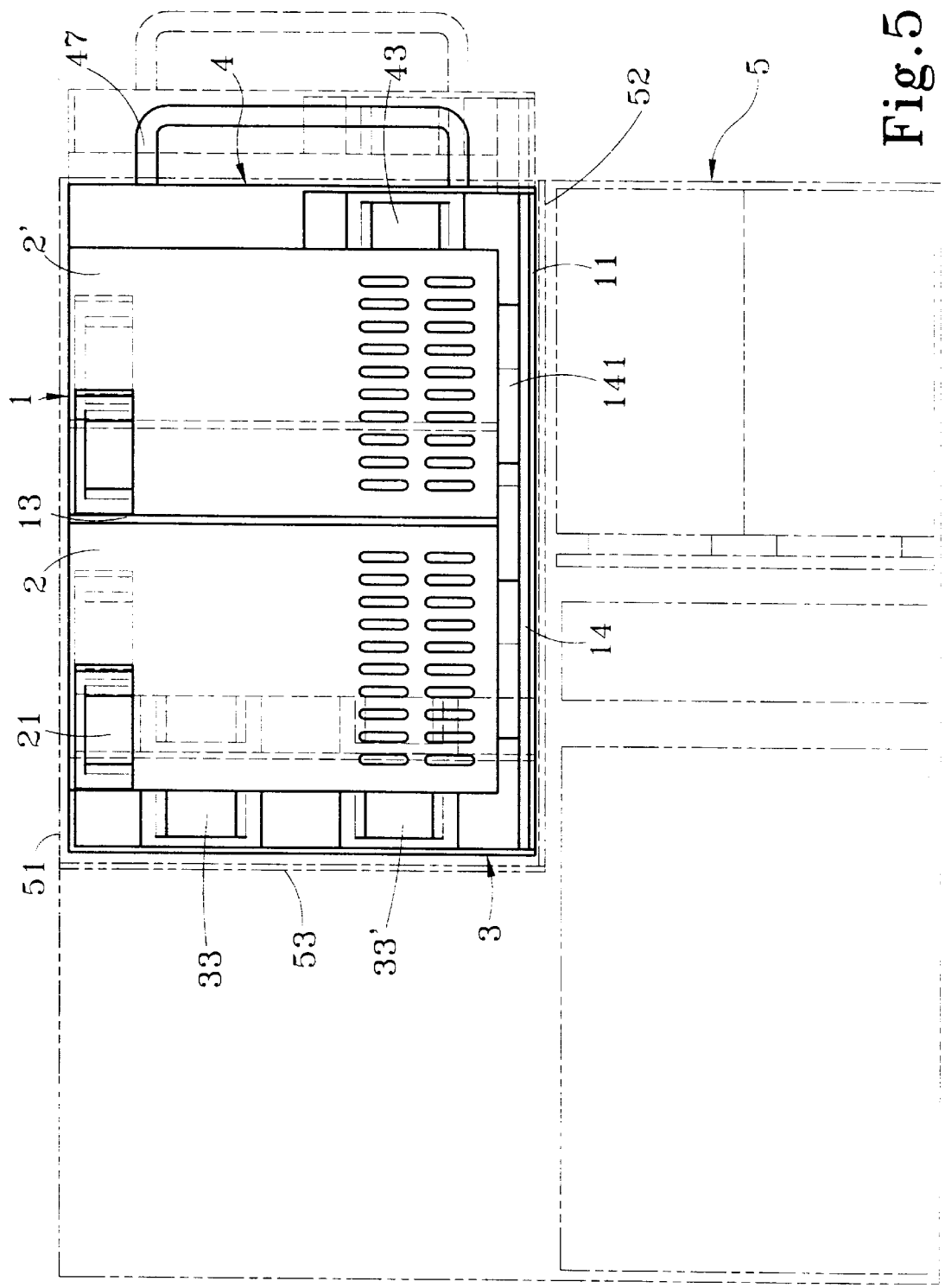
FIG. 5 is a schematic view showing one embodiment of the present invention.

Referring to FIGS. 4 and 5, a schematic view showing one embodiment of the present invention is illustrated. As shown in the figures, by the aforesaid components, after an apparatus for a mainframe having redundant extractable devices, the main body 1 can be placed in the mounting space by the confinement of the lateral space 52 and the lateral wall 51 and the stopping of the rear spacer 53. Then the external power supply can be inserted into the power input port 44. When the computer mainframe 5 is conducted, the user may know whether the two extractable units 2, 2' are operated normally by the display lamp set 45 on the panel 45. Moreover, the radiating fans 21, 33, 33', 43 on the front frame 4, rear frame 3, and two extractable units 2, 2' are operated at the same time. By the through holes 311, 411, 131, and heat dissipating hole 23 on the panels 31, 41 of the front frame 4 and rear frame 3, spacing portion 13, extractable units 2, 2', and the lateral wall 51 on the housing. The airflow due to the operation of the radiating fans 21, 33, 33', 43 will reduce the heat generated by the extractable units 2, 2' and circuit board 14 so as to maintain a normal operation. The direction of the airflow is shown in FIG. 4.

When the two extractable units 2, 2' to be repaired or maintained, the main body 1 can be drawn from the mounting space by the handle 47 at the front frame 3. Then by the confinement of the bottom plate 32 on the front frame 4 and rear frame 3, and the spacing portion 13, the extractable units 2, 2' are drawn out from the openings on the two receiving spaces by the extracting hole 22 thereon so that the extractable units 2, 2' can be updated or maintained. The assembly thereof is performed along a reverse order of the aforesaid steps, the details will not be described further.

Figure 6:
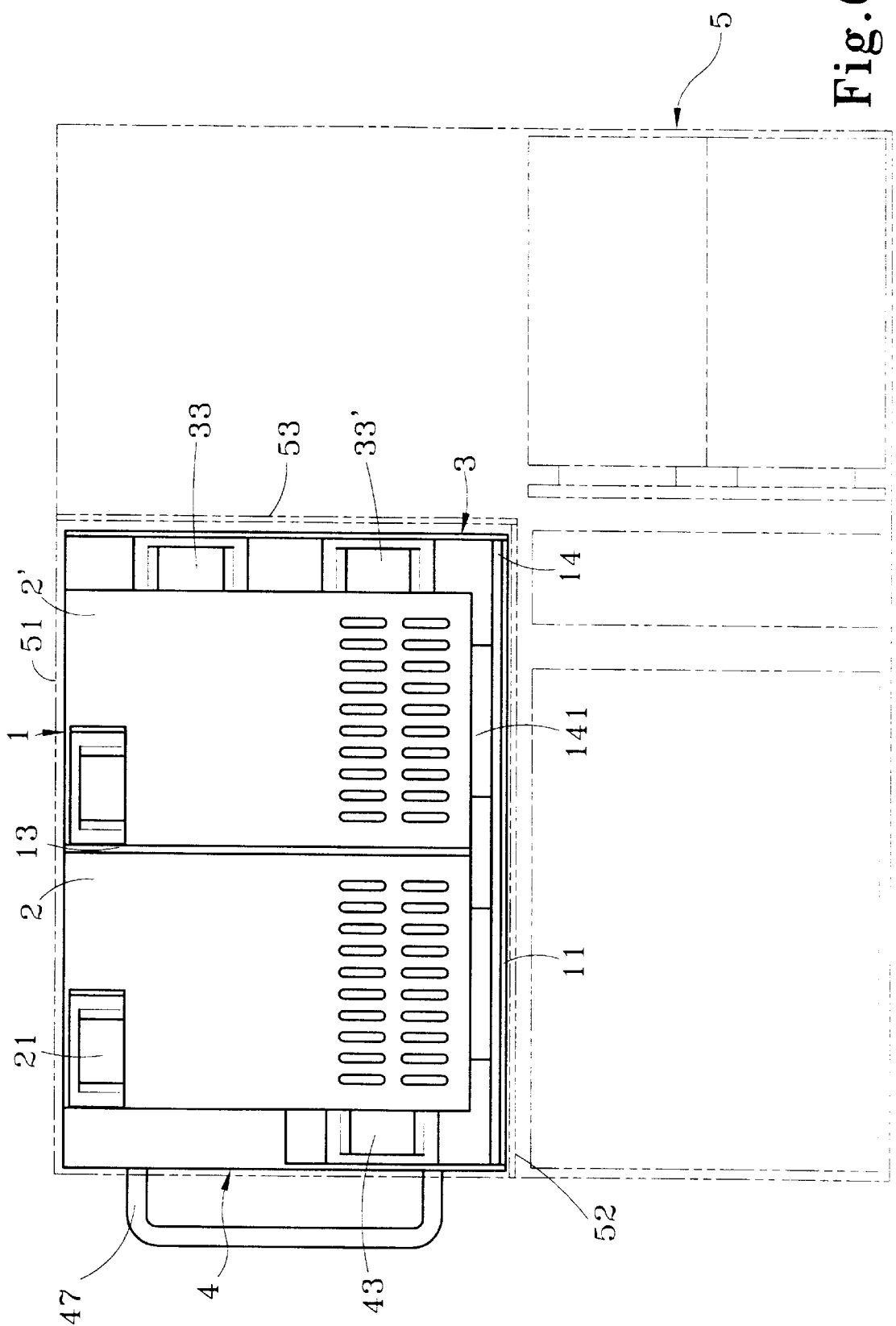
FIG. 6 is a schematic view showing another embodiment of the present invention.

Besides, as shown in FIGS. 5 and 6, the arrangement of the present invention can be changed according to the inserting positions of the power input port 44 and the specifications of the computer mainframe 5.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An apparatus for a mainframe having redundant extractable power supplies, the mainframe including a mounting space having respective openings, comprising:

a main body having at least two receiving spaces with respective openings at one end; closing ends of the two receiving spaces being arranged with a circuit board;

two extractable units arranged within the receiving spaces and connected to the circuit board, said extractable units being power supplies;

the main body having fixedly mounted thereon a front frame and a rear frame, the front frame and the rear frame being adjacent to the two receiving spaces;

each of the front frame and rear frame having a bottom plate, the front frame having a plurality of through holes and screw holes for being installed with a panel; the panel being arranged with a radiating fan, a power input port, a display lamp set, a restoring switch and a handle arranged to enable the main body to be pulled from the mounting space through one of said respective openings; and the rear frame having a panel which is formed with a plurality of through holes and a screw hole and is installed with a plurality of radiating fans;

wherein the main body is extractable, by means of said handle, from the mounting space in the mainframe, and wherein the two extractable units are extractable from the main body through the two openings so as to be disconnected from the circuit board after the main body has been extracted from the mounting space of the mainframe.

2. The apparatus for a mainframe having redundant extractable devices as claimed in claim 1, wherein the mainframe includes, a supporting portion secured with the circuit board and a bearing portion for bearing the two extractable unit.

3. The apparatus for a mainframe having redundant extractable devices claim 1, wherein the computer mainframe is made, according to the IU specification suitable in industrial computers or servos.

4. The apparatus for a mainframe having redundant extractable devices in claim 1, wherein a hole for enabling the extractable devices to be grasped and drawn from the main body through said openings is formed on each extractable unit.

5. The apparatus for a mainframe having redundant extractable devices in claim 1, wherein the mainframe is a computer mainframe.

6. The apparatus for a mainframe having redundant extractable devices in claim 1, wherein the mainframe is a mainframe of a servo.

* * * * *